US009512356B2

(12) United States Patent
Lyons et al.

(10) Patent No.: US 9,512,356 B2
(45) Date of Patent: *Dec. 6, 2016

(54) PROCESS FOR PREPARING RED-EMITTING PHOSPHORS

(71) Applicant: GENERAL ELECTRIC COMPANY, Schenectady, NY (US)

(72) Inventors: Robert Joseph Lyons, Burnt Hills, NY (US); James Edward Murphy, Niskayuna, NY (US); Anant Achyut Setlur, Jr., Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/267,434

(22) Filed: May 1, 2014

(65) Prior Publication Data

US 2015/0315461 A1 Nov. 5, 2015

(51) Int. Cl.
C09K 11/61 (2006.01)
C09K 11/08 (2006.01)
H01L 33/50 (2010.01)

(52) U.S. Cl.
CPC ............ C09K 11/617 (2013.01); *H01L 33/502* (2013.01); *H01L 33/507* (2013.01); *H01L 2224/48091* (2013.01); *H01L 2924/181* (2013.01)

(58) Field of Classification Search
CPC ... C09K 11/616; C09K 11/617; C09K 11/675; C09K 11/628; C09K 11/645; C09K 11/665; C09K 11/0838; C09K 11/02; C09K 11/664; C09K 2211/181; C09K 2211/188; H01L 33/502; H01L 33/504; H01L 33/507; H01L 33/52; H05B 33/14; Y02B 20/181; Y10T 428/299
USPC ...... 252/301.4 F, 301.4 H, 301.4 R, 301.6 F; 313/486, 503; 362/84, 97.1; 428/403; 257/98
See application file for complete search history.

(56) References Cited

U.S. PATENT DOCUMENTS

| | | | |
|---|---|---|---|
| 2,447,359 A | 8/1948 | Oakley, Jr. | |
| 3,576,756 A | 4/1971 | Russo | |
| 7,358,542 B2 | 4/2008 | Radkov et al. | |
| 7,497,973 B2 | 3/2009 | Radkov et al. | |
| 7,648,649 B2 | 1/2010 | Radkov et al. | |
| 7,847,309 B2 | 12/2010 | Radkov et al. | |
| 8,057,705 B2 * | 11/2011 | Sakuma ................ | C04B 35/597 252/301.4 F |
| 8,057,706 B1 * | 11/2011 | Setlur .................... | C09K 11/02 252/301.4 F |
| 8,252,613 B1 * | 8/2012 | Lyons .................. | C09K 11/617 438/45 |
| 8,491,816 B2 | 7/2013 | Hong et al. | |
| 8,710,487 B2 * | 4/2014 | Lyons .................. | C09K 11/617 257/13 |
| 8,906,724 B2 * | 12/2014 | Murphy ................ | H01L 33/502 438/34 |
| 2010/0091215 A1 | 4/2010 | Fukunaga et al. | |
| 2012/0256125 A1 | 10/2012 | Kaneyoshi et al. | |
| 2013/0264937 A1 | 10/2013 | Sakuta et al. | |

FOREIGN PATENT DOCUMENTS

| | | |
|---|---|---|
| GB | 1360690 A | 7/1974 |
| JP | 2010209311 A | 9/2010 |
| JP | 2012064503 A | 3/2012 |
| JP | 2013014715 A * | 1/2013 |
| WO | 2006028271 A2 | 3/2006 |
| WO | 2009119486 A1 | 10/2009 |
| WO | 2013088313 A1 | 6/2013 |
| WO | 2013121355 A1 | 8/2013 |
| WO | 2013138347 A1 | 9/2013 |

OTHER PUBLICATIONS machine translation of JP2013014715A, printed Nov. 25, 2015.*
Kasa et al., "Mn activated K2ZrF6 and Na2ZrF6 phosphors: Sharp red and oscillatory blue-green emissions", Jul. 5, 2012, Journal of Applied Physics, 112, pp. 013506-1 to 013506-6.*
Ryota et al., "Photoluminescent properties of cubic K2MnF6 particles synthesized in metal immersed HF/KMnO4 solutions", Journal of Applied Physics, Dec. 2010, pp. 113503-1-113503-6, vol. 108, Issue 11.
Adachi et al., "Direct synthesis and properties of K2SiF6:Mn4+ phosphor by wet chemical etching of Si wafer", Journal of Applied Physics, Mar. 30, 2008, pp. 023512-1-023512-3, vol. 104, Issue 2.
Ryota et al. "Red and Deep Red Emissions from Cubic K2SiF6:Mn4+ and Hexagonal K2MnF6 Synthesized in HF/KMnO4/KHF2/Si Solutions", Journal of The Electrochemical Society, Dec. 21, 2011, pp. J89-J95, vol. 159, Issue 4.
Paulusz, "Efficient Mn(IV) Emission in Fluorine Coordination", Journal of The Electrochemical Society, Jul. 1973, pp. 942-947, vol. 120, Issue 7.

(Continued)

*Primary Examiner* — Matthew E Hoban
*Assistant Examiner* — Lynne Edmondson
(74) *Attorney, Agent, or Firm* — Mary Louise Stanford

(57) ABSTRACT

A process for preparing a $Mn^{4+}$ doped phosphor of formula I $$A_x[MF_y]:Mn^{+4} \qquad \text{I}$$

includes combining in an acidic solution, an $A^+$ cation, an anion of formula $MF_y$, and a $Mn^{n+}$ source comprising a fluoromanganese compound, precipitating a $Mn^{n+}$ containing phosphor precursor from the acidic solution, and contacting the $Mn^{n+}$ containing phosphor precursor with a fluorine-containing oxidizing agent in gaseous form, at an elevated temperature, to form the $Mn^{4+}$ doped phosphor; wherein A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is the absolute value of the charge of the [MFy] ion;
y is 5, 6 or 7; and
n is 2 or 3.

15 Claims, 3 Drawing Sheets

(56) References Cited

OTHER PUBLICATIONS

Takahashi et al., "Mn4+ -Activated Red Photoluminescence in K2SiF6 Phosphor", Journal of the Electrochemical Society, vol. No. 155, Issue No. 12, pp. E183-E188, 2008.

Arai et al., "A Yellow Phosphor K2SiF6 Activated by Mn2+ Ions", Journal of Applied Physics, vol. No. 108, pp. 1-7, 2010.

Xu et al., "Properties of Mn4+-Activated Hexafluorotitanate Phosphors", Journal of the Electrochemical Society, vol. No. 158, Issue No. 3, pp. J58-J65, 2011.

European Search Report and Opinion issued in connection with corresponding EP Application No. 15165904.2 on Jul. 16, 2015.

U.S. Appl. No. 14/267,449, filed May 1, 2014, James Edward Murphy et al.

Bode et al., "On a New Production of Potassium-Hexafluoromanganate(IV)", Angewandte Chemie, vol. No. 65, Issue No. 11, pp. 304, Jun. 7, 1953.

Mariusz et al., "Synthesis and Luminescent Properties of Red-Emitting Phosphors: ZnSiF6.6H2O and ZnGeF6.6H2O Doped with Mn4+", Journal of Luminescence, vol. No. 137, pp. 88-92, Jan. 4, 2013.

European Search Report and Opinion issued in connection with corresponding EP Application No. 15165675.8 on Sep. 18, 2015.

\* cited by examiner

PROCESS FOR PREPARING RED-EMITTING PHOSPHORS

CROSS-REFERENCE TO RELATED APPLICATIONS

This application is related to U.S. patent application Ser. No. 14/267,449, on May 1, 2014, the entire disclosure of which is incorporated herein by reference.

BACKGROUND

Red-emitting phosphors based on complex fluoride materials activated by $Mn^{4+}$ such as those described in U.S. Pat. No. 7,358,542, U.S. Pat. No. 7,497,973, and U.S. Pat. No. 7,648,649, can be utilized in combination with yellow/green emitting phosphors such as YAG:Ce or other garnet compositions to achieve warm white light (CCTs<5000 K on the blackbody locus, color rendering index (CRI)>80) from a blue LED, equivalent to that produced by current fluorescent, incandescent and halogen lamps. These materials absorb blue light strongly and efficiently emit between about 610-635 nm with little deep red/NIR emission. Therefore, luminous efficacy is maximized compared to red phosphors that have significant emission in the deeper red where eye sensitivity is poor. Quantum efficiency can exceed 85% under blue (440-460 nm) excitation.

Methods for preparation of the phosphors typically require hydrofluoric acid as a solvent. For example, WO 2007/100824 describes preparation of complex fluoride phosphors using aqueous HF as solvent. The processes utilize significant quantities of this highly toxic material, and alternatives that eliminate HF or at least reduce the amount are economically advantageous.

BRIEF DESCRIPTION

Briefly, in one aspect, the present invention relates to an HF-free process for preparing a $Mn^{4+}$ doped phosphor of formula I

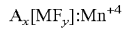

$$A_x[MF_y]:Mn^{+4} \qquad I$$

wherein
  A is Li, Na, K, Rb, Cs, or a combination thereof;
  M is Si, Ge, Sn, Ti, Zr, Al, Ga, In, Sc, Hf, Y, La, Nb, Ta, Bi, Gd, or a combination thereof;
  x is the absolute value of the charge of the $[MF_y]$ ion;
  y is 5, 6 or 7; and
  n is 2 or 3.

The process includes combining in an acidic solution, an A+ cation, an anion of formula MFy, and a $Mn^{n+}$ source comprising a fluoromanganese compound; precipitating a $Mn^{n+}$ containing phosphor precursor from the acidic solution; and contacting the $Mn^{n+}$ containing phosphor precursor with a fluorine-containing oxidizing agent in gaseous form, at an elevated temperature, to form the $Mn^{4+}$ doped phosphor.

In particular embodiments, a solution of a $Mn^{n+}$ source in aqueous fluorosilicic acid is added to a solution of KF in water to precipitate the $Mn^{n+}$ containing phosphor precursor, $K_2SiF_6:Mn^{2+}$ or $K_2SiF_6:Mn^{3+}$.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
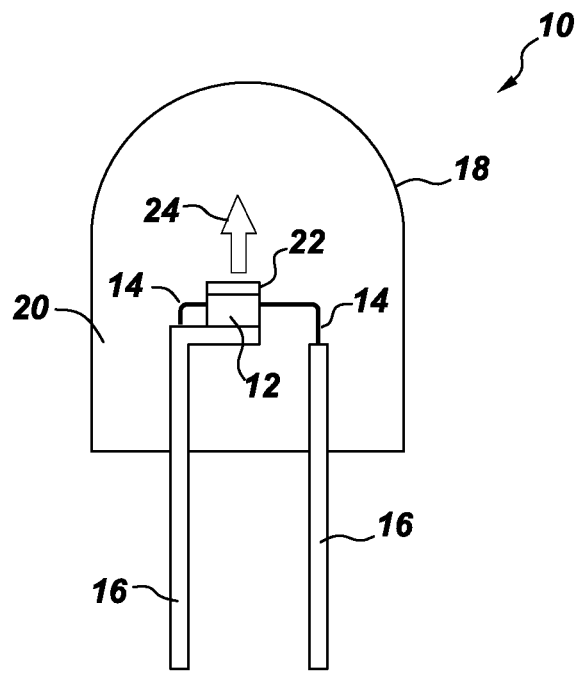
FIG. 1 is a schematic cross-sectional view of a lighting apparatus in accordance with one embodiment of the invention.

In the processes of the present invention, an acidic solution is the medium in which the A+ cation, the anion of formula MFy, and the $Mn^{n+}$ source are combined to form the $Mn^{n+}$ containing precursor. Suitable acidic solutions are ones in which both the anion of formula $MF_y$, and the $Mn^{n+}$ fluoroanion of the precursor are stable. The acid may be of formula $H_x[MF_y]$; examples of suitable acids include $H_2SiF_6$, $H_2GeF_6$, $H_2TiF_6$, and combinations thereof. In particular embodiments, the acid is fluorosilicic acid.

The A+ cations may be supplied as a salt, the corresponding anion for $A^+$ may be fluoride, chloride, acetate, chloride, oxalate, dihydrogen phosphate, or a combination thereof, particularly fluoride. Examples of suitable materials include KF, KHF, LiF, $LiHF_2$, NaF, $NaHF_2$, RbF, $RbHF_2$, CsF, $CsHF_2$, and combinations thereof. In particular embodiments, the anion is fluoride. The anion of formula $MF_y$ may be obtained from the acid of formula $H_x[MF_y]$, or a compound such as $Cs_2SiF_6$ or $MgSiF_6.6H_2O$ may be used. Fluoromanganese compounds suitable for use as the $Mn^{n+}$ source yield the $Mn^{n+}$ fluoroanion when dissolved in the acidic solution. Examples of suitable $Mn^{2+}$ sources include $K_2MnF_4$, $KMnF_3$, $MnF_2$, manganese (II) acetate, manganese(II) oxide, manganese(II) carbonate, manganese(II) nitrate, and combinations thereof. Examples of suitable $Mn^{3+}$ sources include $K_2MnF_5.H_2O$, $KMnF_4$, and $MnF_3$, manganese (III) acetate, manganese(III) oxide, and combinations thereof. Hydrated forms of the $Mn^{n+}$ sources may produce low concentrations of HF. $Mn^{4+}$ sources, such as $MnF_4$, $K_2MnF_6$, and $MnO_2$, may also be used, but may have limited stability or solubility in non-HF-containing solutions, leading to manganese reduction.

The anion of formula $MF_y$, and $Mn^{n+}$ source are combined with an $A^+$ cation and an anion of formula $MF_y$ in the acidic solution, and the $Mn^{n+}$ containing phosphor precursor is precipitated. Fluoride or bifluoride anion, or a combination thereof may also be present in the solution; a convenient source of the A+ cation and the fluoride or bifluoride anion may be the fluoride or bifluoride salt of $A^+$, AF or $AHF_2$. In particular embodiments, the $Mn^{n+}$ source is combined with the acid, which may also provide the anion of formula $MF_y$, and the $A^+$ cation is added thereto. In some cases, the $A^+$ cation is dissolved in a basic solution, for example, an aqueous solution of a carbonate or hydroxide of A+. The order of addition is not necessarily the same in all embodiments, and in some cases, the KF solution may be added to the acid solution. Amounts of the raw materials for the $MF_y$, anion, the $Mn^{n+}$ fluoroanion and AF are determined by the stoichiometry of the reaction to form the precursor.

The precursor may be a $Mn^{n+}$ containing complex fluoride phosphor of formula III $$A_m[MF_z]:Mn^{n+} \quad\quad\quad III$$

wherein

A, M, and n are as defined above, m is the absolute value of the charge of the $[MF_z]$ ion; and $4 \leq z \leq 7$.

One example of a $Mn^{n+}$ containing phosphor precursor that may be formed as an intermediate in a process according to the present invention is $Mn^{3+}$ containing $K_2SiF_6$.

In particular embodiments, the phosphor of formula I is $K_2SiF_6:Mn^{4+}$, and the $Mn^{n+}$ source is combined with the $SiF_6$ anion and KF to yield the $Mn^{n+}$ containing $K_2SiF_6$. For example, the $Mn^{n+}$ source may be dissolved in aqueous fluorosilicic acid and added to a solution of KF in water to precipitate the $Mn^{n+}$ containing phosphor precursor, $K_2SiF_6:Mn^{2+}$ or $K_2SiF_6:Mn^{3+}$.

In some embodiments, the $Mn^{4+}$ doped phosphor of formula I is sparingly soluble in the aqueous acidic solution and precipitates upon formation. If the phosphor is not sufficiently insoluble in the medium to precipitate, a poor solvent may be added to the solution, causing the phosphor to precipitate. Suitable solvents for use as the poor solvent are those that are not attacked by $Mn^{n+}$ and include alcohols, ketones, carboxylic acids, and phosphoric acid, particularly acetone.

The $Mn^{n+}$ containing phosphor precursor may be converted to the $Mn^{4+}$ doped phosphor by contact with a fluorine-containing oxidizing agent in gaseous form at an elevated temperature. The temperature may range from about 200° C. to about 700° C., particularly from about 350° C. to about 600° C. during contact, and in some embodiments from about 200° C. to about 700° C. In various embodiments of the present invention, the temperature is at least 100° C., particularly at least 225° C., and more particularly at least 350° C. The phosphor precursor is contacted with the oxidizing agent for a period of time sufficient to convert it to a $Mn^{4+}$ doped phosphor. Time and temperature are interrelated, and may be adjusted together, for example, increasing time while reducing temperature, or increasing temperature while reducing time. The contacting step may include multiple periods of contact, of varying time and temperature, and the precursor may be rehomogenized between the periods to improve uniformity of the treatment. In particular embodiments, the phosphor precursor is contacted with the oxidizing agent for a period of at least eight hours and a temperature of at least 250° C., for example, at about 425° C. for about four hours and then at a temperature of about 560° C. for about four hours.

The fluorine-containing oxidizing agent may be $F_2$, HF, $SF_6$, $BrF_5$, $NH_4HF_2$, $NH_4F$, KF, $AlF_3$, $SbF_5$, $ClF_3$, $BrF_3$, KrF, $XeF_2$, $XeF_4$, $NF_3$, $SiF_4$, $PbF_2$, $ZnF_2$, $SnF_2$, $CdF_2$ or a combination thereof. In particular embodiments, the fluorine-containing oxidizing agent is $F_2$. The amount of oxidizing agent in the atmosphere may be varied, particularly in conjunction with variation of time and temperature. Where the fluorine-containing oxidizing agent is $F_2$, the atmosphere may include at least 0.5% $F_2$, although a lower concentration may be effective in some embodiments. In particular the atmosphere may include at least 5% $F_2$ and more particularly at least 20% $F_2$. The atmosphere may additionally include nitrogen, helium, neon, argon, krypton, xenon, and combinations with the fluorine-containing oxidizing agent. In particular embodiments, the atmosphere contains about 20% $F_2$ and about 80% nitrogen.

The manner of contacting the $Mn^{n+}$ containing phosphor precursor with the fluorine-containing oxidizing agent is not critical and may be accomplished in any way sufficient to convert the phosphor precursor to a phosphor having the desired properties. In some embodiments, the chamber containing the precursor may be dosed and then sealed such that an overpressure develops as the chamber is heated, and in others, the fluorine and nitrogen mixture is flowed throughout the anneal process ensuring a more uniform pressure. In some embodiments, an additional dose of the fluorine-containing oxidizing agent may be introduced after a period of time.

A flux material may be mixed with the $Mn^{n+}$ containing precursor before annealing. Use of a flux may be desirable where the $Mn^{n+}$ containing phosphor precursor is deficient in $A^+$ relative to the product $Mn^{4+}$ doped phosphor, that is, where the ratio $[A^+]/([Mn^{n+}]+[M])$ is less than or equal to 2, but is not limited thereto. Suitable $A^+$-containing flux materials for use as a flux include compounds of formula AX, $EX_2$, $MF_2$ or $MF_3$, where M is Si, Ge, Sn, Ti, Zr, Al, Ga, In, Sc, Hf, Y, La, Nb, Ta, Bi, Gd, or a combination thereof, particularly monofluorides and bifluorides of potassium, sodium and rubidium, KF and $KHF_2$, NaF and $NaHF_2$, RbF and $RbHF_2$, and combinations thereof. In particular embodiments, the $A^+$-containing flux material is KF or $KHF_2$, or a combination thereof. The flux material may be removed from the phosphor product by washing with a suitable solvent, such as acetic acid.

Color stability and quantum efficiency of phosphors prepared by a process according to the present invention may be enhanced by treating the phosphor in particulate form with a saturated solution of a composition of formula II $$A_x[MF_y] \quad\quad\quad II$$

in aqueous hydrofluoric acid, as described in U.S. Pat. No. 8,252,613. For example, $K_2SiF_6:Mn^{4+}$ maybe treated with a solution of $K_2SiF_6$ in HF at room temperature to improve color stability and quantum efficiency of the phosphor. The temperature at which the phosphor is contacted with the solution ranges from about 20° C. to about 50° C. The period of time required to produce the phosphor ranges from about one minute to about five hours, particularly from about five minutes to about one hour. Concentration of hydrofluoric acid in the aqueous HF solutions ranges from about 20% w/w to about 70% w/w, particularly about 40% w/w to about 70% w/w. Less concentrated solutions may result in lower yields of the phosphor.

The $Mn^{n+}$ containing phosphor precursors utilized in processes according to the present invention and $Mn^{4+}$ doped phosphors produced thereby are complex fluoride materials. In the context of the present invention, the term complex fluoride material means a coordination compound, containing at least one coordination center, surrounded by fluoride ions acting as ligands, and charge-compensated by counter ions as necessary. In one example, $K_2SiF_6:Mn^{4+}$, the coordination center is Si and the counterion is K. Complex fluorides are occasionally written down as a combination of simple, binary fluorides but such a representation does not indicate the coordination number for the ligands around the coordination center. The square brackets (occasionally omitted for simplicity) indicate that the complex ion they encompass is a new chemical species, different from the simple fluoride ion. The activator ion ($Mn^{4+}$) also acts as a coordination center, substituting part of the centers of the host lattice, for example, Si. The host lattice (including the counter ions) may further modify the excitation and emission properties of the activator ion.

In some embodiments, $Mn^{4+}$ doped phosphors that may be prepared by a process according to the present invention are selected from the group consisting of (A) $A_2[MF_5]:Mn^{4+}$, where M is selected from Al, Ga, In, and combinations thereof;

(B) $A_3[MF_6]:Mn^{4+}$, where M is selected from Al, Ga, In, and combinations thereof;

(C) $Zn_2[MF_7]:Mn^{4+}$, where M is selected from Al, Ga, In, and combinations thereof;

(D) $A[In_2F_7]:Mn^{4+}$;

(E) $A_2[MF_6]:Mn^{4+}$, where M is selected from Ge, Si, Sn, Ti, Zr, and combinations thereof;

(F) $E[MF_6]:Mn^{4+}$, where E is selected from Mg, Ca, Sr, Ba, Zn, and combinations thereof; and where M is selected from Ge, Si, Sn, Ti, Zr, and combinations thereof;

(G) $Ba_{0.65}Zr_{0.35}F_{2.70}:Mn^{4+}$;

(H) $A_3[ZrF_7]:Mn^{4+}$;

wherein A is Li, Na, K, Rb, Cs, or a combination thereof. Examples of $Mn^{4+}$ doped phosphors that may be prepared by a process according to the present invention include $K_2[SiF_6]:Mn^{4+}$, $K_2[TiF_6]:Mn^{4+}$, $Cs_2[TiF_6]:Mn^{4+}$, $Rb_2[TiF_6]:Mn^{4+}$, $Cs_2[SiF_6]:Mn^{4+}$, $Rb_2[SiF_6]:Mn^{4+}$, $Na_2[TiF_6]:Mn^{4+}$, $Na_2[ZrF_6]:Mn^{4+}$, $K_3[ZrF_7]:Mn^{4+}$, $K_3[BiF_6]:Mn^{4+}$, $K_3[YF_6]:Mn^{4+}$, $K_3[LaF_6]:Mn^{4+}$, $K_3[GdF_6]:Mn^{4+}$, $K_3[NbF_7]:Mn^{4+}$, $K_3[TaF_7]:Mn^{4+}$. In particular embodiments of the, the coordination center M is Si, Ge, Sn, Ti, Zr, or a combination thereof. More particularly, the coordination center is Si, Ge, Ti, or a combination thereof, the counterion A in formula I is Na, K, Rb, Cs, or a combination thereof, and y is 6.

$Mn^{4+}$ doped phosphors prepared by a process according to the present invention may display good color stability after exposure to light flux. A lighting apparatus incorporating a $Mn^{4+}$ doped phosphor prepared by a process according to the present invention may have a color shift of ≤1.5 MacAdam ellipses after operating for at least 2,000 hour at a LED current density greater than 2 A/cm², a LED wall-plug efficiency greater than 40%, and a board temperature greater than 25° C., preferably wherein the MacAdam ellipse color shift is ≤1. Under accelerated test conditions, the lighting apparatus may have a color shift of ≤2 MacAdam ellipses after operating for 30 minutes at a LED current density greater than 70 A/cm², a LED wall-plug efficiency greater than 18%, and a board temperature greater than 25° C. Stability of the phosphor outside an LED package as measured by % intensity loss of the phosphor after exposure to light flux of at least 80 w/cm² at a temperature of at least 50° C.; % intensity loss of the color stable phosphors may be ≤4% after 21 hours.

A lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self-supported electrodes and the lead frame may be omitted. The leads 14 provide current to LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable Ill-V, II-VI or IV-IV semiconductor layers and having an emission wavelength of about 250 to 550 nm. In particular, the LED may contain at least one semiconductor layer comprising GaN, ZnSe or SiC. For example, the LED may comprise a nitride compound semiconductor represented by the formula $In_iGa_jAl_kN$ (where 0≤i; 0≤j; 0≤k and 1+j+k=1) having an emission wavelength greater than about 250 nm and less than about 550 nm. In particular embodiments, the chip is a near-uv or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

In lighting apparatus 10, phosphor composition 22 is radiationally coupled to the LED chip 12. Radiationally coupled means that the elements are associated with each other so radiation from one is transmitted to the other. Phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of phosphor composition 22 and LED 12. Thus, phosphor composition 22 may be coated over or directly on the light emitting surface of the LED chip 12 by coating and drying the phosphor suspension over the LED chip 12. In the case of a silicone-based suspension, the suspension is cured at an appropriate temperature. Both the shell 18 and the encapsulant 20 should be transparent to allow white light 24 to be transmitted through those elements. Although not intended to be limiting, in some embodiments, the median particle size of the phosphor composition ranges from about 1 to about 50 microns, particularly from about 15 to about 35 microns.

In other embodiments, phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by phosphor composition 22, and the mixed light appears as white light. If the phosphor is to be interspersed within the material of encapsulant 20, then a phosphor powder may be added to a polymer or silicone precursor, loaded around the LED chip 12, and then the polymer precursor may be cured to solidify the polymer or silicone material. Other known phosphor interspersion methods may also be used, such as transfer loading.

In yet another embodiment, phosphor composition 22 is coated onto a surface of the shell 18, instead of being formed over the LED chip 12. The phosphor composition is preferably coated on the inside surface of the shell 18, although the phosphor may be coated on the outside surface of the shell, if desired. Phosphor composition 22 may be coated on the entire surface of the shell or only a top portion of the surface of the shell. The UV/blue light emitted by the LED chip 12 mixes with the light emitted by phosphor composition 22, and the mixed light appears as white light. Of course, the phosphor may be located in any two or all three locations or in any other suitable location, such as separately from the shell or integrated into the LED.

Figure 2:
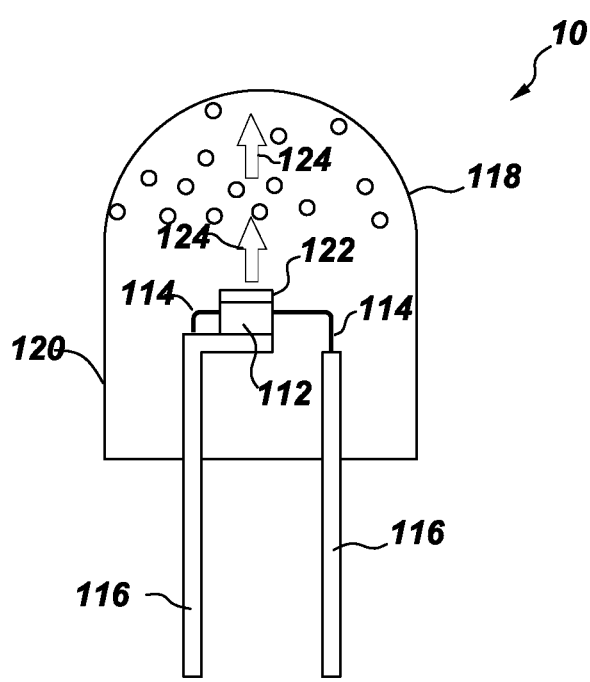
FIG. 2 is a schematic cross-sectional view of a lighting apparatus in accordance with another embodiment of the invention.

FIG. 2 illustrates a second structure of the system according to the present invention. Corresponding numbers from FIGS. 1-4 (e.g. 12 in FIG. 1 and 112 in FIG. 2) relate to corresponding structures in each of the figures, unless otherwise stated. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material or throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer or silicone precursor may then be cured to solidify the polymer or silicone. Other known phosphor interspersion methods may also be used, such as transfer molding.

Figure 3:
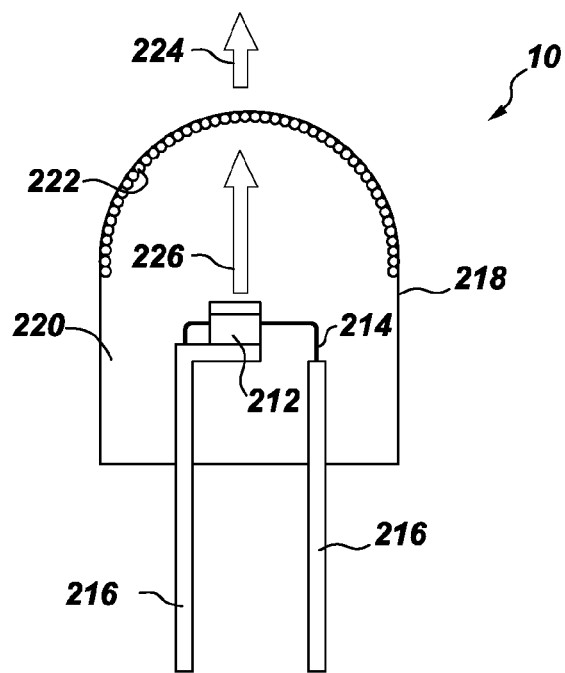
FIG. 3 is a schematic cross-sectional view of a lighting apparatus in accordance with yet another embodiment of the invention.

FIG. 3 illustrates a third possible structure of the system according to the present invention. The structure of the embodiment shown in FIG. 3 is similar to that of FIG. 1, except that the phosphor composition 222 is coated onto a surface of the envelope 218, instead of being formed over the LED chip 212. The phosphor composition 222 is preferably coated on the inside surface of the envelope 218, although the phosphor may be coated on the outside surface of the envelope, if desired. The phosphor composition 222 may be coated on the entire surface of the envelope, or only a top portion of the surface of the envelope. The radiation 226 emitted by the LED chip 212 mixes with the light emitted by the phosphor composition 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp may also include a plurality of scattering particles (not shown), which are embedded in the encapsulant material. The scattering particles may comprise, for example, alumina or titania. The scattering particles effectively scatter the directional light emitted from the LED chip, preferably with a negligible amount of absorption.

Figure 4:
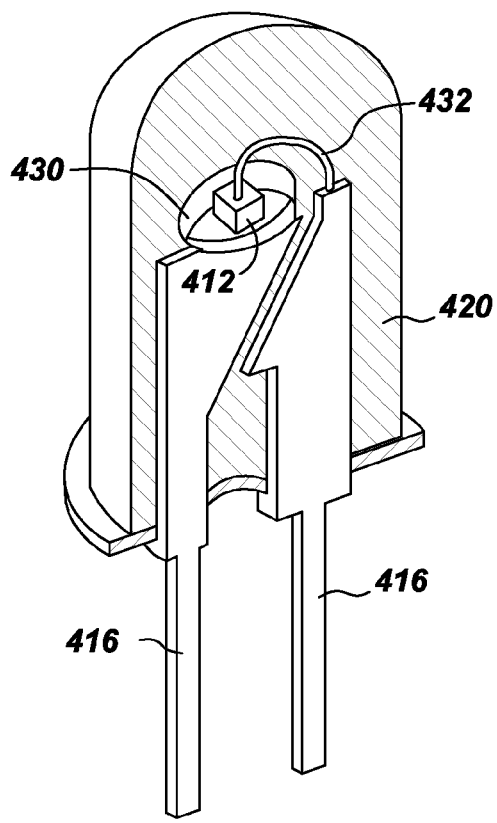
FIG. 4 is a cutaway side perspective view of a lighting apparatus in accordance with one embodiment of the invention.

As shown in a fourth structure in FIG. 4, the LED chip 412 may be mounted in a reflective cup 430. The cup 430 may be made from or coated with a dielectric material, such as alumina, titania, or other dielectric powders known in the art, or be coated by a reflective metal, such as aluminum or silver. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
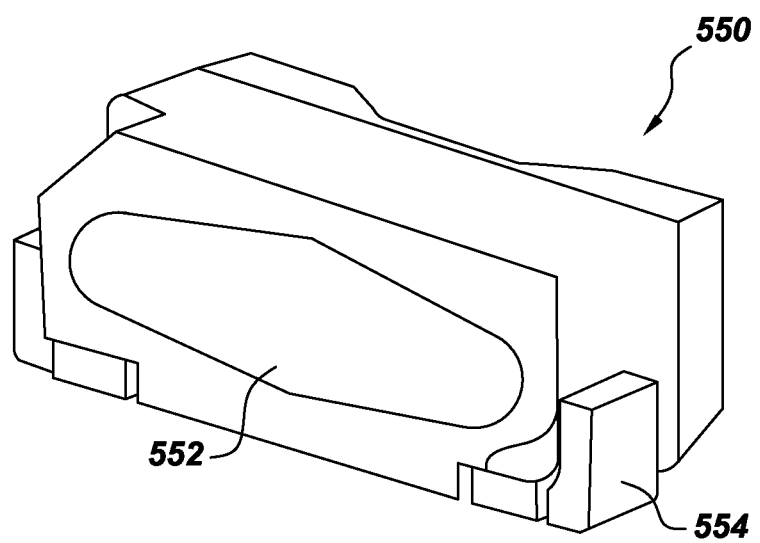
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. An SMD package may comprise an LED chip as defined above, and a phosphor material that is excited by the light emitted from the LED chip. Other backlight devices include, but are not limited to, TVs, computers, smartphones, tablet computers and other handheld devices that have a display including a semiconductor light source and a $Mn^{4+}$ doped phosphor prepared by a process according to the present invention.

When used with an LED emitting at from 350 to 550 nm and one or more other appropriate phosphors, the resulting lighting system will produce a light having a white color. Lamp 10 may also include scattering particles (not shown), which are embedded in the encapsulant material. The scattering particles may comprise, for example, alumina or titania. The scattering particles effectively scatter the directional light emitted from the LED chip, preferably with a negligible amount of absorption.

In addition to the $Mn^{4+}$ doped phosphor, phosphor composition 22 may include one or more other phosphors. When used in a lighting apparatus in combination with a blue or near UV LED emitting radiation in the range of about 250 to 550 nm, the resultant light emitted by the assembly will be a white light. Other phosphors such as green, blue, yellow, red, orange, or other color phosphors may be used in the blend to customize the white color of the resulting light and produce specific spectral power distributions. Other materials suitable for use in phosphor composition 22 include electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly(vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

Suitable phosphors for use in phosphor composition 22 include, but are not limited to:
$((Sr_{1-z}(Ca, Ba, Mg, Zn)_z)_{1-(x+w)}(Li, Na, K, Rb)_w Ce_x)_3 (Al_{1-y}Si_y)O_{4+y3+(x-w)}F_{1-y-3(x-w)}$, $0<x\leq0.10$, $0\leq y\leq0.5$, $0\leq z\leq0.5$, $0\leq w\leq x$; $(Ca, Ce)_3Sc_2Si_3O_{12}$ (CaSiG); $(Sr,Ca,Ba)_3Al_{1-x}Si_xO_{4+x}F_{1-x}:Ce^{3+}$ (SASOF)); $(Ba,Sr,Ca)_5(PO_4)_3(Cl,F,Br,OH):Eu^{2+}, Mn^{2+}$; $(Ba,Sr,Ca)BPO_5:Eu^{2+}, Mn^{2+}$; $(Sr,Ca)_{10}(PO_4)_6*vB_2O_3:Eu^{2+}$ (wherein $0<v\leq1$); $Sr_2Si_3O_8*2SrCl_2:Eu^{2+}$; $(Ca,Sr,Ba)_3MgSi_2O_8:Eu^{2+}, Mn^{2+}$; $BaAl_8O_{13}:Eu^{2+}$; $2SrO*0.84P_2O_5*0.16B_2O_3:Eu^{2+}$; $(Ba,Sr,Ca)MgAl_{10}O_{17}:Eu^{2+}, Mn^{2+}$; $(Ba,Sr,Ca)Al_2O_4:Eu^{2+}$; $(Y,Gd,Lu,Sc,La)BO_3:Ce^{3+}, Tb^{3+}$; $ZnS:Cu^+, Cl^-$; $ZnS:Cu^+, Al^{3+}$; $ZnS:Ag^+, Cl^-$; $ZnS:Ag^+, Al^{3+}$; $(Ba,Sr,Ca)_2Si_{1-\xi}O_{4-2\xi}:Eu^{2+}$ (wherein $0\leq\xi\leq0.2$); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_{5-\alpha}O_{12-3/2\alpha}:Ce^{3+}$ (wherein $0\leq\alpha\leq0.5$); $(Ca,Sr)_8(Mg,Zn)(SiO_4)_4Cl_2:Eu^{2+}, Mn^{2+}$; $Na_2Gd_2B_2O_7:Ce^{3+}, Tb^{3+}$; $(Sr,Ca,Ba,Mg,Zn)_2P_2O_7:Eu^{2+}, Mn^{2+}$; $(Gd,Y,Lu,La)_2O_3:Eu^{3+}, Bi^{3+}$; $(Gd,Y,Lu,La)_2O_2S:Eu^{3+}, Bi^{3+}$; $(Gd,Y,Lu,La)VO_4:Eu^{3+}, Bi^{3+}$; $(Ca,Sr)S:Eu^{2+}, Ce^{3+}$; $SrY_2S_4:Eu^{2+}$; $CaLa_2S_4:Ce^{3+}$; $(Ba,Sr,Ca)MgP_2O_7:Eu^{2+}, Mn^{2+}$; $(Y,Lu)_2WO_6:Eu^{3+}, Mo^{6+}$; $(Ba,Sr, Ca)$_\beta$Si$_\gamma$N$_\mu$:Eu$^{2+}$ (wherein 2β+4γ=3μ); Ca$_3$(SiO$_4$)Cl$_2$:Eu$^{2+}$; (Lu,Sc,Y,Tb)$_{2-u-v}$Ce$_v$Ca$_{1+u}$Li$_w$Mg$_{2-w}$P$_w$(Si,Ge)$_{3-w}$O$_{12-u/2}$ (where −0.5≤u≤1, 0<v≤0.1, and 0≤w≤0.2); (Y,Lu,Gd)$_{2-\phi}$Ca$_\phi$Si$_4$N$_{6+\phi}$C$_{1-\phi}$:Ce$^{3+}$, (wherein 0≤φ≤0.5); (Lu,Ca,Li,Mg, Y), α-SiAlON doped with Eu$^{2+}$ and/or Ce$^{3+}$; (Ca,Sr,Ba) SiO$_2$N$_2$:Eu$^{2+}$, Ce$^{3+}$; β-SiAlON:Eu$^{2+}$, 3.5MgO*0.5MgF$_2$* GeO$_2$:Mn$^{4+}$; Ca$_{1-c-f}$Ce$_c$Eu$_f$Al$_{1+c}$Si$_{1-c}$N$_3$, (where 0≤c≤0.2, 0≤f≤0.2); Ca$_{1-h-r}$Ce$_h$Eu$_r$Al$_{1-h}$(Mg,Zn)$_h$SiN$_3$, (where 0≤h≤0.2, 0≤r≤0.2); Ca$_{1-2s-t}$Ce$_s$(Li,Na)$_s$Eu$_t$AlSiN$_3$, (where 0≤s≤0.2, 0≤f≤0.2, s+t>0); and Ca$_{1-\sigma-\chi-\phi}$Ce$_\sigma$(Li,Na)$_\chi$Eu$_\phi$Al$_{1+\sigma-\chi}$Si$_{1-\sigma+\chi}$N$_3$, (where 0≤σ≤0.2, 0≤χ≤0.4, 0≤φ≤0.2).

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.20 to about 0.55, and a y value in the range of about 0.20 to about 0.55. As stated, however, the exact identity and amounts of each phosphor in the phosphor composition can be varied according to the needs of the end user. For example, the material can be used for LEDs intended for liquid crystal display (LCD) backlighting. In this application, the LED color point would be appropriately tuned based upon the desired white, red, green, and blue colors after passing through an LCD/color filter combination.

Mn$^{4+}$ doped phosphors prepared by a process according to the present invention may be used in applications other than those described above. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are merely exemplary and not limiting.

EXAMPLES

General Procedures

Stability Testing
High Light Flux Conditions

A laser diode emitting at 446 nm was coupled to an optical fiber with a collimator at its other end. The power output was 310 mW and the beam diameter at the sample was 700 microns. This is equivalent to a flux of 80 W/cm$^2$ at the sample surface. The spectral power distribution (SPD) spectrum that is a combination of the scattered radiation from the laser and the emission from the excited phosphor is collected with a 1 meter (diameter) integrating sphere and the data processed with the spectrometer software (Specwin). At intervals of two minutes, the integrated power from the laser and the phosphor emission were recorded over a period of about 21 hours by integrating the SPD from 400 nm to 500 nm and 550 nm to 700 nm respectively. The first 90 minutes of the measurement are discarded to avoid effects due to the thermal stabilization of the laser. The percentage of intensity loss due to laser damage is calculated as follows:

$$\text{Intensity loss } (\%) = 100 \frac{(\text{Power} - \text{Initial power})}{\text{Initial power}}$$

While only the emitter power from the phosphor is plotted, the integrated power from the laser emission as well as its peak position was monitored to ensure that the laser remained stable (variations of less than 1%) during the experiment.

COMPARATIVE EXAMPLE 1

Preparation of K$_2$SiF$_6$:Mn$^{4+}$

A Mn-doped potassium fluorosilicate phosphor, K$_2$SiF$_6$:Mn$^{4+}$, obtained from a commercial source, containing 0.84 wt % Mn, based on total weight was annealed at 540° C. in 10 psia under a 20% F$_2$/80% N$_2$ atmosphere for 8 hours. The annealed phosphor powder was treated with a saturated solution of K$_2$SiF$_6$ by placing the powder (~10 g) in a Teflon beaker containing 100 mL of a saturated solution of K$_2$SiF$_6$ (initially made by adding ~17 g of K$_2$SiF$_6$ in 40% HF at room temperature, stirring, and filtering the solution). The suspension was stirred slowly, and the residue is filtered and dried under vacuum. The dried filtrate was washed with acetone 3-5 times and heated at 100° C. for 10 minutes to remove HF.

Example 1

Preparation of K$_2$MnF$_5$.H$_2$O

A solution of hydrochloric acid (45 ml of 37% HCl) was gradually added to a slurry of potassium bifluoride (15.62 g KHF$_2$) and potassium permanganate (15.8 g KMnO$_4$) in 10.5 ml 48-49% HF. After the addition was complete, the temperature was increased to 70° C. to complete the reaction and drive off dissolved Cl$_2$. The contents of the flask were vacuum filtered. The filtrate was rinsed with glacial acetic acid to remove KHF$_2$, and with acetone three times, then dried in a vacuum desiccator. Yield: 23 grams of pink-rose colored K$_2$MnF$_5$.H$_2$O.

Example 2

Preparation of Mn$^{3+}$ containing K$_2$SiF$_6$

A solution of K$_2$CO$_3$ (5.56 g) and KHF$_2$ (3.78 g) in 20 ml water was gradually added to a rapidly stirring solution of K$_2$MnF$_5$.H$_2$O (0.266 g) in 35% H$_2$SiF$_6$ (10 ml). The resulting K$_2$SiF$_6$ slurry was vacuum filtered, rinsed with glacial acetic acid to remove trace KF and KHF$_2$, rinsed three times with acetone, and then dried in a vacuum desiccator.

Example 3

Preparation of Mn$^{4+}$Containing K$_2$SiF$_6$ from Mn$^{3+}$ Containing K$_2$SiF$_6$ A furnace chamber containing the Mn$^{3+}$ containing K$_2$SiF$_6$ of Example 2 was evacuated and then filled with an atmosphere containing 20% fluorine gas and 80% nitrogen gas and heated to 500° C. The furnace was held at that temperature for about 8 hours, then the furnace was cooled. The emission spectrum of the product was essentially identical to that of the K$_2$SiF$_6$:Mn$^{4+}$ material of Comparative Example 1.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A process for preparing a $Mn^{4+}$ doped phosphor of formula I, $$A_x[MF_y]:Mn^{+4} \qquad \text{I}$$

the process comprising combining an $A^+$ cation, an anion of formula $MF_y$, and a $Mn^{n+}$ source comprising a fluoromanganese compound in an acidic solution;
precipitating a $Mn^{n+}$ containing phosphor precursor from the acidic solution; and
contacting the $Mn^{n+}$ containing phosphor precursor with a fluorine-containing oxidizing agent in gaseous form, at an elevated temperature, to form the $Mn^{4+}$ doped phosphor;
wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is 1, 2, or 3, and is the absolute value of the charge of the $[MF_y]$ ion;
y is 5, 6 or 7; and
n is 2 or 3.

2. A process according to claim 1, additionally comprising combining a fluoride or bifluoride anion, or a combination thereof, with the A+ cation, the anion of formula $MF_y$, and the $Mn^{n+}$ source.

3. A process according to claim 1, wherein the $Mn^{4+}$ doped phosphor is $K_2SiF_6:Mn^{4+}$.

4. A process according to claim 1, wherein the anion of formula $[MF_y]$ is $SiF_6$.

5. A process according to claim 1, wherein the A+ cation is derived from KF, $KHF_2$, or a combination thereof.

6. A process according to claim 1, wherein the $Mn^{n+}$ source is selected from $K_2MnF_5.H_2O$, $KMnF_4$, $K_2MnF_4$, $KMnF_3$, $MnF_2$, $MnF_3$, and combinations thereof.

7. A process according to claim 1, wherein the $Mn^{n+}$ source is $K_2MnF_5.H_2O$.

8. A process according to claim 1, wherein the acidic solution is aqueous fluorosilicic acid.

9. A process according to claim 1, wherein the fluorine-containing oxidizing agent is $F_2$.

10. A process according to claim 1, wherein the step of contacting the $Mn^{n+}$ containing phosphor precursor with the fluorine-containing oxidizing agent additionally comprises contacting the $Mn^{n+}$ containing phosphor precursor with the fluorine-containing oxidizing agent and a compound of formula AX, where X is F, Cl, Br, I, $HF_2$, or a combination thereof.

11. A process according to claim 1, comprising
combining a solution comprising fluorosilicic acid and the $Mn^{n+}$ source with a potassium fluoride compound selected from KF, $KHF_2$, and combinations thereof;
precipitating a $Mn^{n+}$ containing phosphor precursor; and
exposing the $Mn^{n+}$ containing phosphor precursor to an atmosphere comprising at least 20% fluorine gas at an elevated temperature, to form the $Mn^{4+}$ doped phosphor;
wherein the $Mn^{n+}$ source comprises a potassium fluoromanganese compound selected from $K_2MnF_5.H_2O$, $KMnF_4$, $MnF_3$, and combinations thereof.

12. A process according to claim 1, treating the phosphor in particulate form with a saturated solution of a composition of formula II in aqueous hydrofluoric acid $$A_x[MF_y] \qquad \text{II.}$$

13. A process for preparing a $Mn^{4+}$ doped phosphor, the process comprising
combining an $A^+$ cation, an anion of formula $MF_y$, and a $Mn^{n+}$ source comprising a fluoromanganese compound in an acidic solution;
precipitating a $Mn^{n+}$ containing phosphor precursor from the acidic solution; and
contacting the $Mn^{n+}$ containing phosphor precursor with a fluorine-containing oxidizing agent in gaseous form, at an elevated temperature, to form the $Mn^{4+}$ doped phosphor; wherein the $Mn^{4+}$ doped phosphor is selected from the group consisting of
(A) $A_2[MF_5]:Mn^{4+}$, where M is selected from Al, Ga, In, and combinations thereof;
(B) $A_3[MF_6]:Mn^{4+}$, where M is selected from Al, Ga, In, and combinations thereof;
(C) $Zn_2[MF_7]:Mn^{4+}$, where M is selected from Al, Ga, In, and combinations thereof;
(D) $A[In_2F_7]:Mn^{4+}$;
(E) $A_2[MF_6]:Mn^{4+}$, where M is selected from Ge, Si, Sn, Ti, Zr, and combinations thereof;
(F) $E[MF_6]:Mn^{4+}$, where E is selected from Mg, Ca, Sr, Ba, Zn, and combinations thereof; and where M is selected from Ge, Si, Sn, Ti, Zr, and combinations thereof;
(G) $Ba_{0.65}Zr_{0.35}F_{2.70}:Mn^{4+}$; and
(H) $A_3[ZrF_7]:Mn^{4+}$; and
A is Li, Na, K, Rb, Cs, or a combination thereof.

14. A process according to claim 13, wherein the acidic solution is aqueous fluorosilicic acid.

15. A process according to claim 13, wherein the fluorine-containing oxidizing agent is $F_2$.

* * * * *